(12) United States Patent
Seong et al.

(10) Patent No.: US 11,251,827 B2
(45) Date of Patent: Feb. 15, 2022

(54) FRONT-END MODULE

(71) Applicant: Samsung Electro-Mechanics Co., Ltd., Suwon-si (KR)

(72) Inventors: Nack Gyun Seong, Suwon-si (KR); Ju Young Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/930,372

(22) Filed: Jul. 16, 2020

(65) Prior Publication Data
US 2021/0320683 A1 Oct. 14, 2021

(30) Foreign Application Priority Data
Apr. 13, 2020 (KR) .................. 10-2020-0044726

(51) Int. Cl.
*H04B 1/401* (2015.01)
*H03F 3/189* (2006.01)
(Continued)

(52) U.S. Cl.
CPC .............. *H04B 1/401* (2013.01); *H01P 5/16* (2013.01); *H03F 1/32* (2013.01); *H03F 3/19* (2013.01);
(Continued)

(58) Field of Classification Search
CPC ........ H04B 1/04; H04B 1/0057; H04B 1/006; H04B 1/10; H04B 1/16; H04B 1/40; H04B 1/401; H04B 1/48; H04B 1/406; H04B 1/7103; H04B 15/00; H04W 84/12; H04W 88/10; H04L 25/0278; H04L 25/03821; H01P 5/12; H01P 5/16; H03F 1/31; H03F 3/19
See application file for complete search history.

(56) References Cited

U.S. PATENT DOCUMENTS 8,401,505 B1 * 3/2013 Bidichandani ........ H04W 84/12
455/232.1
10,505,700 B1 * 12/2019 Lan ........................ H04B 1/525
(Continued)

FOREIGN PATENT DOCUMENTS

KR 10-0865087 B1 10/2008
KR 10-1611381 B1 4/2016

*Primary Examiner* — Quochien B Vuong
(74) *Attorney, Agent, or Firm* — NSIP Law

(57) ABSTRACT

A front-end module is provided. The front-end module includes a reception amplifier configured to amplify a received radio-frequency (RF) signal, first and second series switches configured to control a switching operation to electrically connect an output terminal of the reception amplifier and first and second reception ports to each other, a radio-frequency (RF) splitter configured to simultaneously transfer a received RF signal, amplified by the reception amplifier or bypassing the reception amplifier, to the first and second reception ports, first and second shunt switches configured to control a switching operation to electrically connect a ground and first and second branch nodes between the RF splitter and the first and second reception ports to each other, and first and second reflected wave removing impedance elements electrically connected between the first and second branch nodes and a ground.

14 Claims, 7 Drawing Sheets

(51) Int. Cl.

| | |
|---|---|
| *H04B 1/00* | (2006.01) |
| *H03F 3/19* | (2006.01) |
| *H01P 5/16* | (2006.01) |
| *H04L 25/02* | (2006.01) |
| *H03F 1/32* | (2006.01) |

(52) U.S. Cl.
CPC ......... *H04B 1/006* (2013.01); *H04L 25/0278* (2013.01); *H03F 2200/451* (2013.01)

(56) References Cited

U.S. PATENT DOCUMENTS

| | | | |
|---|---|---|---|
| 10,637,525 B2* | 4/2020 | Nagano | H04B 1/006 |
| 10,772,052 B2* | 9/2020 | O'Shea | H04B 1/406 |
| 10,944,441 B2* | 3/2021 | Medra | H03F 3/19 |
| 2007/0155344 A1* | 7/2007 | Wiessner | H04B 1/48 |
| | | | 455/78 |
| 2011/0065472 A1 | 3/2011 | Zhu et al. | |

* cited by examiner

FRONT-END MODULE

CROSS-REFERENCE TO RELATED APPLICATION(S)

This application claims the benefit under 35 USC 119(a) of Korean Patent Application No. 10-2020-0044726 filed on Apr. 13, 2020 in the Korean Intellectual Property Office, the entire disclosure of which is incorporated herein by reference for all purposes.

BACKGROUND

1. Field

The following description relates to a front-end module.

2. Description of Related Art

To increase the communications speed of wireless local area networks (WLAN), communications technology having a wide bandwidth and a high throughput rate and communications protocol standardization are continuously performed. Standardization of Wi-Fi6 (802.11ax), a next-generation standard, to which technologies such as Orthogonal frequency-division multiple access (OFDMA), multi user-multiple input multiple output (MU-MIMO), and the like, for high-density/high-efficiency WLAN are applied, is currently being implemented to achieve not only an increase in communications speed, but also further improved communications performance in indoor and outdoor environments in which access points (AP) and mobile terminals are crowded. In 2018, the US Federal Communications Commission (FCC) has additionally allocated the 6 GHz band (5.925 to 7.125 GHz) for unlicensed use, so that a bandwidth of 1200 MHz could be secured to support higher communication speeds and to provide various Wi-Fi 6 services.

Additionally, Long Term Evolution (LTE) licensed assisted access (LTE-LAA) carrier aggregation (CA) is in the spotlight for the implementation of smooth service as 5G mobile communication services have been commercialized based on high-speed data transfer. LTE-LAA CA is a technology in which an LTE licensed band and an unlicensed band, including a Wi-Fi frequency, may be combined to transfer data in a wider band. Existing CA technology may successfully implement a higher communications speed, but the higher communications speed did not satisfy a communications speed necessary for 5G mobile communications.

Accordingly, an LTE frequency band of 20 MHz and a Wi-Fi frequency band of 60 MHz, an unlicensed band, were combined to achieve a transfer rate about 10 times higher than a transfer rate of existing LTE, which satisfied the communications speed necessary for 5G mobile communications. Similarly, transmitting and receiving ends of a mobile device, in which LTE-LAA and Wi-Fi wireless environments coexist while satisfying the next-generation Wi-Fi standard, should be provided with a front-end module, having wide band characteristics, that performs a co-existence operation and covers a band of 60 GHz. Additionally, since a low-noise amplifier (LNA) disposed on a reception path may play an important role to affect overall performance of a receiver, low-noise characteristics, a high voltage gain, and linear characteristics may be beneficial.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a front-end module includes a reception amplifier configured to amplify a received radio-frequency (RF) signal; a first series switch configured to control a switching operation to electrically connect an output terminal of the reception amplifier and a first reception port to each other; a second series switch configured to control a switching operation to electrically connect the output terminal of the reception amplifier and a second reception port to each other; a radio-frequency (RF) splitter configured to simultaneously transfer one of a received RF signal that is amplified by the reception amplifier, and a received RF signal that bypasses the reception amplifier, to the first reception port and the second reception port; a first shunt switch configured to control a switching operation to electrically connect a ground and a first branch node between the RF splitter and the first reception port to each other; a second shunt switch configured to control a switching operation to electrically connect the ground and a second branch node between the RF splitter and the second reception port; a first reflected wave removing impedance element electrically connected between the first branch node and the ground; and a second reflected wave removing impedance element electrically connected between the second branch node and the ground.

The front-end module may include a controller configured to operate in a selected mode, among a first mode, a second mode, and a third mode, to control the first series switch and the second series switch, and control the first shunt switch and the second shunt switch, wherein the controller, when configured to operate in the first mode, controls the first series switch and the second shunt switch in an ON state, and controls the second series switch and the first shunt switch in an OFF state, the controller, when configured to operate in the second mode, controls the second series switch and the first shunt switch in an ON state, and controls the first series switch and the second shunt switch in an OFF state, and the controller, when configured to operate in the third mode, controls the first series switch and the second series switch in an ON state, and controls the first shunt switch and the second shunt switch in an OFF state.

The RF splitter may be configured to transfer a received RF signal of a first communications protocol to the first reception port when the controller operates in the first mode, and transfer a received RF signal of a second communications protocol, different from the first communications protocol, when the controller operates in the second mode, and at least a portion of a frequency band of the first communications protocol and at least a portion of a frequency band of the second communications protocol overlap each other.

The front-end module may include a transceiving branch switch electrically connected between an input terminal of the reception amplifier and an antenna port; a third series switch configured to control a switching operation to electrically connect the transceiving branch switch and the first reception port to each other; and a third shunt switch configured to control a switching operation to electrically connect a ground and a node between the transceiving branch switch and the first reception port to each other; wherein the transceiving branch switch is configured to transfer a received RF signal from the antenna port to one of the first reception port and the second reception port through the RF splitter when the transceiving branch switch operates in a receiving mode, and transfer a transmitted RF signal from the first reception port to the antenna port by bypassing the RF splitter when the transceiving branch switch operates in a transmitting mode.

The front-end module may include a transmission amplifier input port configured to be electrically connected to the third series switch, and to be electrically connected to an input terminal of an external transmission amplifier; and a transmission amplifier output port configured to be electrically connected to the transceiving branch switch and to be electrically connected to an output terminal of the transmission amplifier.

The first series switch may be configured to control a switching operation to electrically connect the first branch node and the first reception port to each other, and the second series switch may be configured to control a switching operation to electrically connect the second branch node and the second reception port to each other.

The first reflected wave removing impedance element may be connected in series between the first branch node and the ground, and has a matched resistance value such that a reflected wave of a received RF signal passes from the first branch node to a ground, and the second reflected wave removing impedance element may be connected in series between the second branch node and the ground, and has a matched resistance value such that a reflected wave of a received RF signal passes from the second branch node to a ground.

The first reflected wave removing impedance element may include a first reflected wave removing resistor and a first switch capacitor that are connected in series with each other, and the second reflected wave removing impedance element may include a second reflected wave removing resistor and a second switch capacitor that are connected in series with each other.

The RF splitter may include a first inductor electrically connected in series between an output terminal of the reception amplifier and the first branch node; a second inductor electrically connected in series between an output terminal of the reception amplifier and the second branch node; and a resistor electrically connected between a second end of the first inductor and a second end of the second inductor.

The RF splitter may include a first capacitor electrically connected between a first end of the first inductor and a ground; and a second capacitor electrically connected between a first end of the second inductor and the ground.

The RF splitter may include a first capacitor electrically connected between a first end of the first inductor and the ground; a second capacitor electrically connected between a first end of the second inductor and the ground; a third capacitor electrically connected between a second end of the first inductor and the ground; and a fourth capacitor electrically connected between a second end of the second inductor and the ground.

The first capacitor, the second capacitor, the third capacitor, and the fourth capacitor, and the first inductor and the second inductor may have impedances such that a received RF signal of a fundamental frequency, belonging to a band of 5.1 GHz to 7.2 GHz, may be transferred to at least one of the first reception port and the second reception port.

The reception amplifier may include a first amplifier transistor and a second amplifier transistor combined in a cascode configuration; and an intermediate inductor electrically connected in series between the first amplifier transistor and second amplifier transistors.

The reception amplifier may include a shunt output inductor electrically connected in series between an output terminal of the first amplifier transistor and a power source; a series output capacitor electrically connected in series between the output terminal of the first amplifier transistor and the RF splitter; a shunt output capacitor electrically connected in series between the output terminal of the first amplifier transistor and the RF splitter, and a ground; and a series output inductor electrically connected in series between the output terminal of the first amplifier transistor and the RF splitter.

In a general aspect, a radio-frequency (RF) module includes a first reception port; a second reception port; an RF splitter; a transceiver, configured to receive an RF signal from an antenna port and transmit the received RF signal to one of the first reception port and the second reception port through the RF splitter in a receiving mode, and transfer a transmitted RF signal from the first reception port to the antenna port by bypassing the RF splitter when operating in a transmitting mode; and wherein the RF splitter may be configured to: transmit a first RF signal of the received RF signal to one of the first reception port and the second reception port in a first mode; transmit a second RF signal of the received RF signal to another of the first reception port and the second reception port in a second mode, and simultaneously transmit the first RF signal and the second RF signal to the first reception port and the second reception port in a third mode.

The first RF signal may be of a first communication protocol, and the second RF signal may be of a second communication protocol that is different from the first communication protocol.

Other features and aspects will be apparent from the following detailed description, the drawings, and the claims.

Figure 1A:
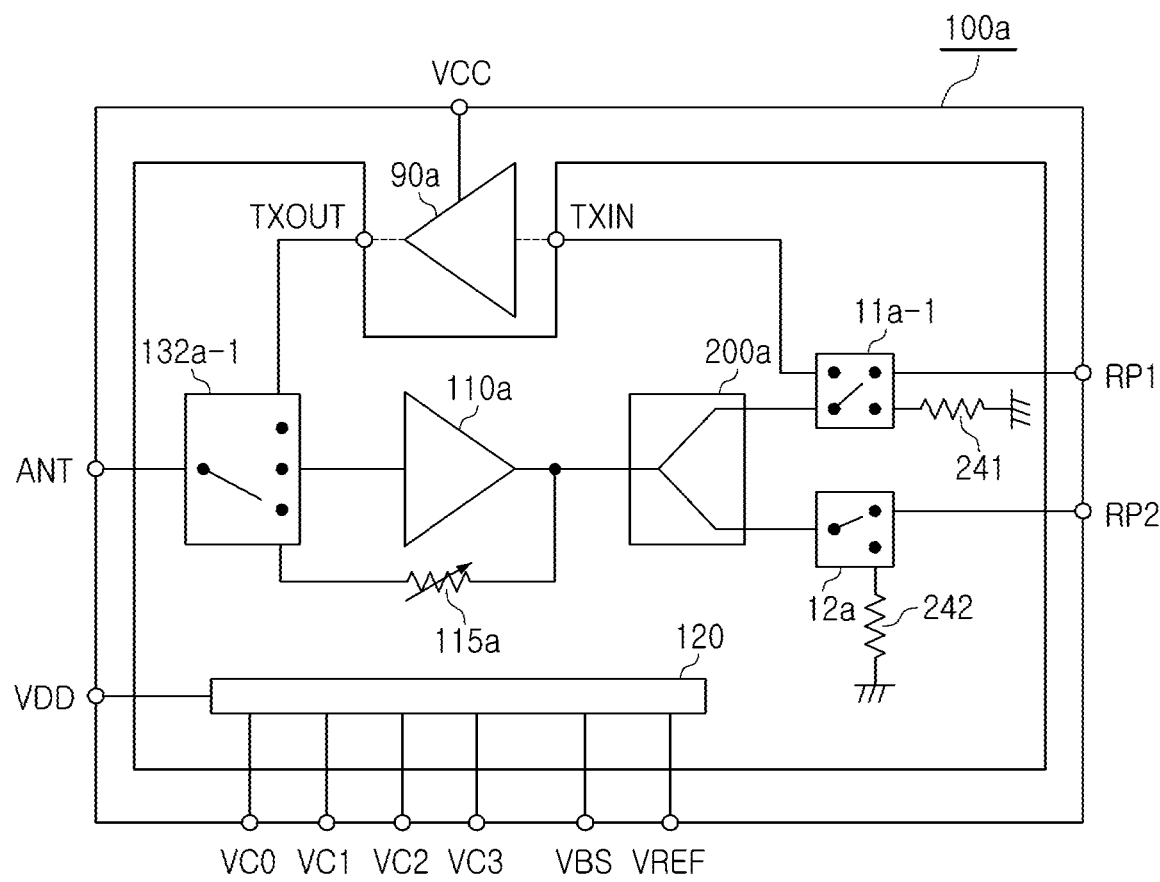
FIG. 1A illustrates an example front-end module, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

FIG. 1A illustrates a front-end module, in accordance with one or more embodiments.

Referring to FIG. 1A, a front-end module 100a according to an example may include a reception amplifier 110a and a radio-frequency (RF) splitter 200a. In a non-limiting example, all circuits included in the front-end module 100a may be configured as a single integrated circuit (IC), and the RF splitter 200a may be embedded in the front-end module 100a.

The reception amplifier 110a may amplify a received radio-frequency (RF) signal. The received RF signal may be remotely received by an antenna electrically connected to an antenna port ANT, and the reception amplifier 110a may amplify the received RF signal while suppressing an increase in noise due to amplification.

The received RF signal may be transferred to a first reception port RP1 and/or a second reception port RP2 through the RF splitter 200a in a state in which the received RF signal is amplified by the reception amplifier 110a or the received RF signal bypasses the reception amplifier 110a through a bypass path 115a.

The RF splitter 200a may be electrically connected between an output terminal of the reception amplifier 110a and the first and second reception ports RP1 and RP2, and may selectively transfer the received RF signal to selective ones of the first and second reception ports RP1 and RP2, or may simultaneously transfer the received RF signal to the first and second reception ports RP1 and RP2.

For example, the received RF signal may simultaneously include a first RF signal of a first communication standard (for example, Wi-Fi) and a second RF signal of a second communication standard (as a non-limited example, LTE Licensed Assisted Access (LTE-LAA)). The first and second RF signals may be simultaneously transmitted to both the first and second reception ports RP1 and RP2.

Accordingly, a first communication modem electrically connected to the first reception port RP1, and a second communication modem electrically connected to the second reception port RP2 may process the first and second RF signals at a speed two or more times higher than in a time division duplexing (TDD) manner to obtain received information.

The RF splitter 200a may have a first transmission impedance between an output terminal of the reception amplifier 110a and the first reception port RP1 and a second transmission impedance between an output terminal of the reception amplifier 110a and the second reception port RP2. When the respective first and second transmission impedances match impedances corresponding to frequencies of the respective first and second RF signals of respective different communication standards included in the received RF signal, the respective first and second RF signals may be simultaneously transferred to the first and second reception ports RP1 and RP2.

For example, the RF splitter 200a may simultaneously transfer the respective first and second RF signals, included in the received RF signal, to both the first and second reception ports RP1 and RP2 using only passive elements.

A first communication of a first communications protocol, and a second communication of a second communications protocol may be individually performed depending on an environment or implementation of each of the first and second communications, or an environment or implementation of an electronic device in which the front-end module 100a is disposed.

The first and second communication modems may be temporarily switched to operate in a manner, in which the first and second communications are individually performed, such as, for example, a TDD manner. In this example, the first RF signal, transferred to the second communication modem when the first communication modem receives the first RF signal, may deteriorate reception sensitivity of the second RF signal of the second communication modem or performance of the front-end module 100a, and the second RF signal, transferred to the first communication modem when the second communication modem receives the second RF signal, may deteriorate reception sensitivity of the first RF signal of the first communication modem or the performance of the front-end module 100a.

Therefore, the front-end module 100a may simultaneously transfer the first and second RF signals, included in the received RF signal, to both the first and second reception ports RP1 and RP2. The front-end module 100a may also selectively transfer the first and second RF signals, included in the received RF signal, to a corresponding one of the first and second reception ports RP1 and RP2.

Referring to FIG. 1A, the front-end module 100a may include a first branch switch 11a-1, a second branch switch 12a, a first reflected wave removing impedance element 241, and a second reflected wave removing impedance element 242.

The first branch switch 11a-1 may include a first series switch and a first shunt switch, and may operate and select one of a path between the RF splitter 200a and the first reception port RP1, and a path between the RF splitter 200a and the first reflected wave removing impedance element 241.

The second branch switch 12a may include a second series switch and a second shunt switch, and may operate to select one of a path between the RF splitter 200a and the second reception port RP2, and a path between the RF splitter 200a and the second reflected wave removing impedance element 242.

When the first branch switch 11a-1 electrically connects the RF splitter 200a and the first reception port RP1 to each other, and the second branch switch 12a separates the RF splitter 200a and the second reception port RP2, the received RF signal may not be transferred to the second reception port RP2.

In an example, the RF splitter 200a may simultaneously transfer the received RF signal to the first and second reception ports RP1 and RP2, irrespective of the operation of the first and second branch switches 11a-1 and 12a.

When the second branch switch 12a only separates the RF splitter 200a and the second reception port RP2, among elements of the received RF signal, an element transferred to the second reception port RP2 may be reflected on the second branch switch 12a. A reflected wave of the received RF signal may be transferred to the reception amplifier 110a, and may deteriorate performance of the reception amplifier 110a and may deteriorate the overall performance of the front-end module 100a through the RF splitter 200a.

The second branch switch 12a of the front-end module 100a may electrically connect the second reflected wave removing impedance element 242 to the RF splitter 200a, while separating the RF splitter 200a and the second reception port (RP2) from each other. Accordingly, the second reflected wave removing impedance element 242 may remove an element received RF signal transferred to the second reception port RP2, among elements of the received RF signal, and may prevent performance degradation of the reception amplifier 110a and prevent overall performance degradation of the front-end module 100a.

The second branch switch 12a may electrically connect the RF splitter 200a and the second reception port RP2 to each other, and the received RF signal may not be transferred to the first reception port RP1 when the first branch switch 11a-1 separates the RF splitter 200a and the first reception port RP1 from each other.

In an example, the RF splitter 200a may simultaneously transfer the received RF signal to the first and second reception ports RP1 and RP2, irrespective of operations of the first and second branch switches 11a-1 and 12a.

When the first branch switch 11a-1 only separates the RF splitter 200a and the first reception port RP1 from each other, among elements of the RF signal, an element transferred to the first reception port RP1 may be reflected on the first branch switch 11a-1. A reflected wave of the received RF signal may be transferred to the reception amplifier 110a to deteriorate performance of the reception amplifier 110a, and may cause deterioration in overall performance of the front-end module 100a through the RF splitter 200a.

The first branch switch 11a-1 of the front-end module 100a may electrically connect the first reflected wave removing impedance element 241 to the RF splitter 200a while separating the RF splitter 200a and the first reception port RP1 from each other. Accordingly, the first reflected wave removing impedance element 241 may remove the element transferred to the first reception port RP1, among elements of the received RF signal, and may prevent deterioration in overall performance of the reception amplifier 110a and front-end module 100a.

Referring to FIG. 1A, the front-end module 100a may further include a controller 120.

The controller 120 may control the first and second branch switches 11a-1 and 12a. When operating in a first mode, the controller 120 may operate such that the reception RF signal is transferred to only the first reception port RP1, rather than the second reception port RP2. When operating in a second mode, the controller 120 may operate such that the reception RF signal is transferred to only the second reception port RP2, rather than the first reception port RP1. When operating in a third mode, the controller may operate such that the reception RF signal is simultaneously transferred to both the first and second reception ports RP1 and RP2.

In an example, the first branch switch 11a-1 and the second branch switch 12a may include a semiconductor transistor, and the controller 120 may output a control voltage input to a gate terminal of the semiconductor transistor. The semiconductor transistor may electrically connect a drain terminal and a source terminal of the semiconductor transistor to each other when a control voltage is high, and may separate the drain terminal and the source terminal of the semiconductor transistor from each other when the control voltage is low.

For example, the controller 120 may receive mode control voltages VC0, VC1, VC2, and VC3, a bias voltage VBS, and power source VREF from an external device (for example, a communication modem or a PMIC) of the front-end module 100a VREF, may control the first and second branch switches 11a-1 and 12a based on mode control voltages VC0, VC1, VC2, and VC3, may use a bias voltage VBS and the power source VREF, and may provide the bias voltage VBS and the power source VREF to the reception amplifier 110a.

For example, the front-end module 100a may transfer a reception RF signal of a first communications protocol (for example, W-Fi) to the first reception port RP1 when the controller 120 operates in the first mode, may transfer a reception RF signal of a second communications protocol (for example, LTE-LAA), different from the first communications protocol, when the controller 120 operates in the second mode, and may simultaneously transfer reception RF signals of the first and second communications protocols to the first and second reception ports RP1 and RP2 when the controller 120 operates in the third mode. In this example, at least a portion of a frequency band of the first communications protocol and at least a portion of a frequency band of the second communications protocol may overlap each other.

Referring to FIG. 1A, the front-end module 100a may further include a transceiving branch switch 132a-1 electrically connected between an input terminal of the reception amplifier 110a and the antenna port ANT.

The first branch switch 11a-1 may operate to select one of a path through the RF splitter 200a and a path bypassing the RF splitter 200a, among a plurality of paths between the first reception port RP1 and the transceiving branch switch 132a-1. In an example, the first branch switch 11a-1 may further include a third series switch and a third shunt switch.

In an example, the transceiving branch switch 132a-1 may be configured to transfer the received RF signal from the antenna port ANT to the first reception port RP1 or the second reception port RP2 through the RF splitter 200a when operating in the receiving mode, and to transfer the transmitted RF signal from the first reception port RP1 to the antenna port ANT by bypassing the RF splitter 200a when operating in the transmitting mode. For example, the first reception port RP1 may be used as a transmission path of a transmitted RF signal as well as the received RF signal.

Accordingly, a circuit electrically connected to the first reception port RP1 may not only receive the received RF signal through the RF splitter 200a, but may also transfer the RF signal to the antenna ANT or receive the RF signal from the antenna ANT by bypassing the RF splitter 200a. When the RF signal is transferred by bypassing the RF splitter 200a, the transceiving branch switch 132a-1 and the first branch switch 11a-1 may inhibit the reflected wave of the RF signal from being transferred to the RF splitter 200a.

For example, the front-end module 100a may include a transmission amplifier input port, configured to be electrically connected to a first branch switch 11a-1 and electrically connected to an input terminal of an external transmission amplifier 90a, and a transmission amplifier output port configured to be electrically connected to the transceiving branch switch 132a-1 and electrically connected to an output terminal of the transmission amplifier 90a.

In an example, the front-end module 100a may provide the transmission path of the transferred RF signal, but may not include the transmission amplifier 90a.

Since the transmission amplifier 90a amplifies a relatively high power transmission RF signal, the transmission amplifier 90a may be separated from the transmission amplifier 110a and the radio-frequency splitter 200a of the front-end module 100a to be more advantageously implemented to enhance energy efficiency. Since a ratio of power consumption of the transmission amplifier 90a is high relative to overall power consumption of the antenna to the communication modem, the transmission amplifier 90a may be separated from the front-end module 100a to reduce the overall power consumption of the antenna to the communication modem.

Figure 1B:
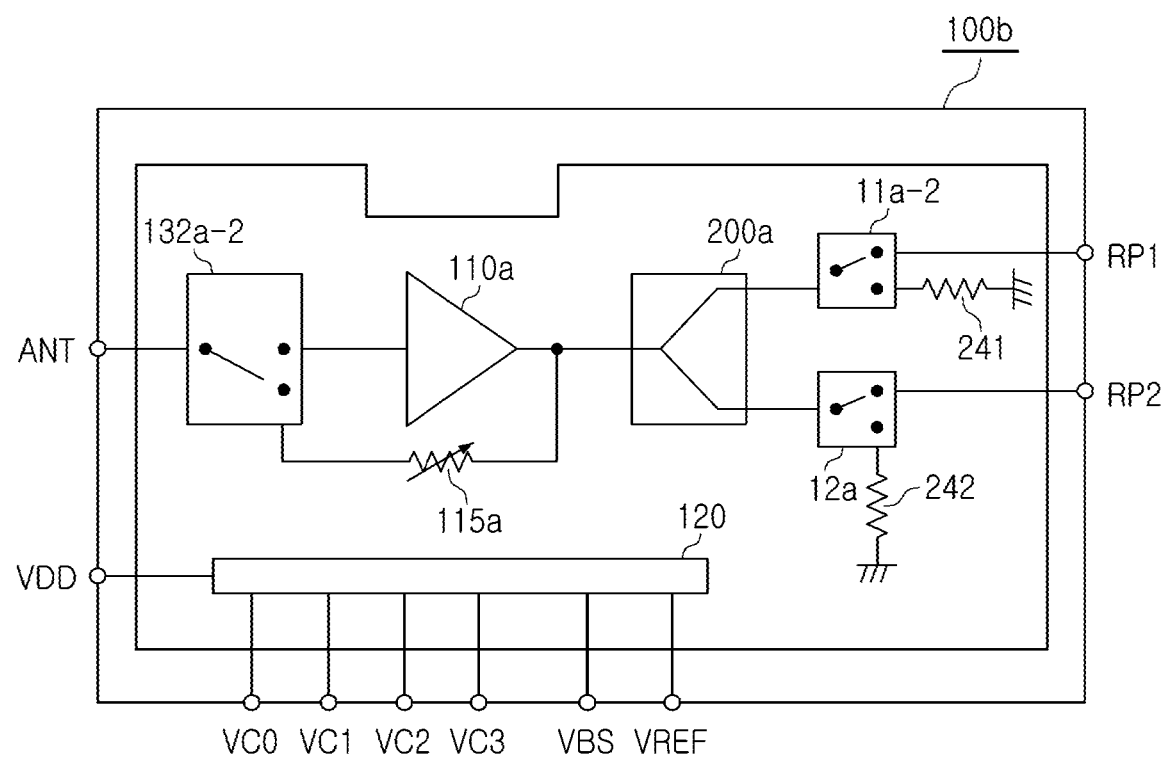
FIG. 1B illustrates a structure in which a transmitter is omitted in an example front-end module, in accordance with one or more embodiments.

FIG. 1B illustrates a structure in which a transmitter is omitted in a front-end module, in accordance with one or more embodiments.

Referring to FIG. 1B, a front-end module 100b according to an example may include a first branch switch 11a-2 with a reduced branch path, and may include a transmitting/receiving branch switch 132a-2 with a reduced branch path.

The transmitting/receiving branch switch 132a-2 may be configured such that a transmitted RF signal does not pass therethrough.

Figure 2A:
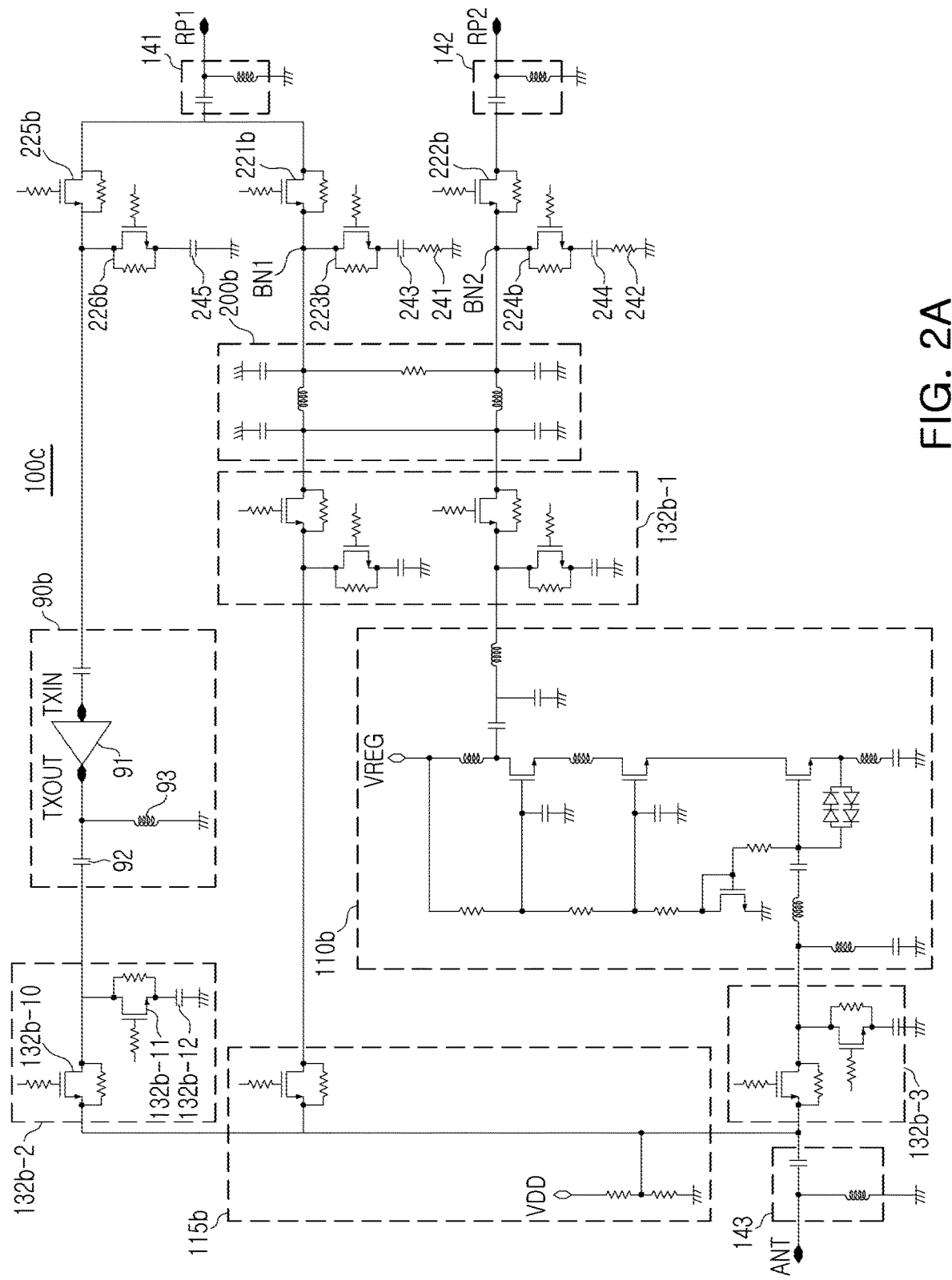
FIG. 2A is a circuit diagram of an example front-end module, in accordance with one or more embodiments.

FIG. 2A is a circuit diagram of a front-end module, in accordance with one or more embodiments.

Referring to FIG. 2A, a front-end module 100c according to an example may include a reception amplifier 110b and a radio-frequency (RF) splitter 200b, and may include a first series switch 221b, a second series switch 222b, a first shunt switch 223b, and a second shunt switch 224b.

A combination of the first series switch 221b and the first shunt switch 223b may correspond to the first branch switch illustrated in FIGS. 1A and 1B, and a combination of the second series switch 222b and a second shunt switch 224b may correspond to the second branch switch illustrated in FIGS. 1A and 1B.

The first series switch 221b may be configured to control switching operations to electrically connect an output terminal of a reception amplifier 110b and a first reception port RP1 to each other, and the second series switch 222b may be configured to control switching operations to electrically connect an output terminal of the reception amplifier 110b and the second reception port RP2 to each other.

The first shunt switch 223b may be configured to control switching operations to electrically connect a ground and a first branch node BN1 between the RF splitter 200b and the first reception port RP1 to each other, and the second shunt switch 224b may be configured to control switching operations to electrically connect a ground and a second branch node BN2 between the RF splitter 200b and the second reception port RP2 to each other.

Each of the first and second series switches 221b and 222b and the first and second shunt switches 223b and 224b may control switching operations to electrically connect a drain terminal and a source terminal of a semiconductor transistor to each other, based on a voltage on a gate terminal, may have a structure in which a gate resistor is connected through a gate terminal, and may have a structure in which a drain resistor having a high resistance value is connected between a drain terminal and a source terminal. The drain resistor and/or the gate resistor may be omitted, and the semiconductor transistor may be implemented as a different type of transistor than a field effect transistor.

In an example, each of the first and second series switches 211b and 212b and the first, second, third, and fourth shunt switches 221b, 222b, 223b, and 224b may be implemented as a silicon-on-insulator (SOI)-based DGNFET having improved frequency characteristics.

When the controller operates in a first mode, the first series switch 221b and the second shunt switch 224b may enter an ON state and the second series switch 222b and the first shunt switch 223b may enter an OFF state.

Accordingly, the first reception port RP1 may be electrically connected to the RF splitter 200b, and the second reflected wave removing impedance element 242 may be electrically connected to the RF splitter 200b.

When the controller operates in a second mode, the second series switch 222b and the first shunt switch 223b may enter an ON state and the first series switch 221b and the second shunt switch 224b may enter an OFF state.

Accordingly, the second reception port RP2 may be electrically connected to RF splitter 200b and the first reflected wave removing impedance element 241 may be electrically connected to the RF splitter 200b.

When the controller operates in a third mode, the first and second series switches 221b and 222b may enter an ON state and the first and second shunt switches 223b and 224b may enter an OFF state.

Accordingly, the first and second reception ports RP1 and RP2 may be electrically connected to the RF splitter 200b and the received RF signal may be simultaneously transferred to the first and second reception ports RP1 and RP2.

The first series switch 221b may be disposed to be closer to the first reception port RP1 than the first shunt switch 223b to control switching operations to electrically connect the first branch node BN1 and the first reception port RP1 to each other, and the second series switch 222b may be disposed to be closer to the second reception port RP2 than the second shunt switch 224b to control switching operations to electrically connect the second branch node BN2 and the second reception port RP2 to each other.

The first reflected wave removing impedance element 241 may be connected in series between the first branch node BN1 and a ground, and may have a matched resistance value (for example, 50 ohms) such that the reflected wave of the received RF signal passes from the first branch node BN1 to the ground, and the second reflected wave removing impedance element 242 may be connected in series between the second branch node BN2 and a ground and may have a matched resistance value (for example, 50 ohms) such that the reflected wave of the received RF signal passes from the second branch node BN2 to the ground. Accordingly, the reflected wave of the received RF signal may be transferred to the ground through the first or second reflected wave removing element 241 or 242 to be removed.

The first reflected wave removing impedance element 241 may include a first reflected wave removing resistor and a first switch capacitor 243 connected in series with each other, and a second reflected wave removing impedance element 242 may include a second reflected wave removing resistor and a second switch capacitor 244 connected in series with each other. Accordingly, the first and second switch capacitors 243 and 244 may contribute to a resonant frequency of the RF splitter 200b to widen a bandwidth of the first and second switch capacitors 243 and 244.

Referring to FIG. 2A, a front-end module 100c according to an example may further include at least one of a third series switch 225b, a third shunt switch 226b, and a third switch capacitor 245.

A combination of the first and third series switches 221b and 225b and the first and third shunt switches 223b and 226b may correspond to the first branch switch illustrated in FIG. 1A.

Referring to FIG. 2A, a front-end module 100c may include at least one of a bypass path 115b, transceiving branch switches 132b-1, 132b-2, and 132b-3, and a matching terminal 141 of a first reception port, a matching terminal 142 of a second reception port, and a matching terminal 143 of an antenna port.

The transceiving branch switch 132b-2 may include a series switch 132b-10, a shunt switch 132b-11, and a capacitor 132b-12, and the transmission amplifier 90b may include a power amplifier 91, a capacitor 92, and an inductor 93.

The reception amplifier 110b may be supplied with power source VREG, and the bypass path 115b may be supplied with power source VDD.

Figure 2B:
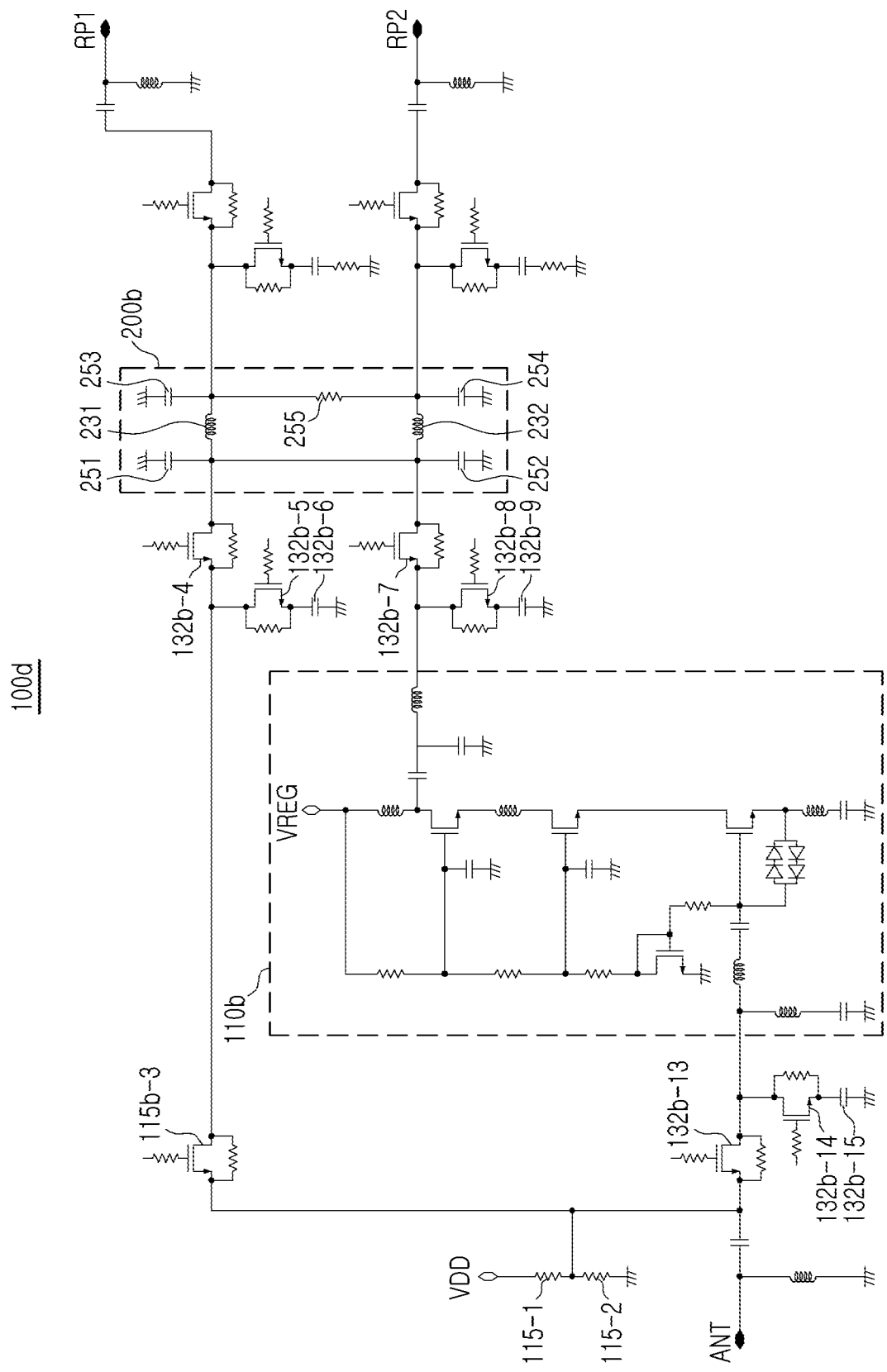
FIG. 2B is a circuit diagram illustrating a structure in which a transmitter is omitted in a front-end module, in accordance with one or more embodiments.

FIG. 2B is a circuit diagram illustrating a structure in which a transmitter is omitted in a front-end module in accordance with one or more embodiments.

Referring to FIG. 2B, a radio-frequency (RF) splitter 200b of a front-end module 100d according to an example may include at least a portion of a first inductor 231, a second inductor 232, a first capacitor 251, a second capacitor 252, a third capacitor 253, a fourth capacitor 254, and a resistor 255.

The first inductor 231 may be electrically connected in series between a common branch node and a first branch node, the second inductor 232 may be electrically connected in series between the common branch node and a second branch node, the resistor 255 may be electrically connected in series between the first and second branch nodes.

In an example, the first and second inductors 231 and 232 and the resistor 255 may be passive elements. A combination of the first inductor 231 and the resistor 255 may constitute at least a portion of a first transmission impedance between an output terminal of a reception amplifier 110a and the first reception port RP1, and a combination of the second inductor 232 and resistors 240a may constitute at least a portion of a second transmission impedance between the output terminal of the reception amplifier 110a and a second reception port RP2. When the first and second transmission impedances match impedances corresponding to the frequencies of the first and second RF signals included in the received RF signal, the first and second RF signals may be simultaneously transferred to both the first and second reception ports RP1 and RP2.

The first capacitor 251 may be electrically connected between the other end of the first inductor 231 and a ground, the second capacitor 252 may be connected between the other end of the second inductor 232 and a ground, the third capacitor 253 may be electrically connected between one end of the first inductor 231 and a ground, and the fourth capacitor 254 may be electrically connected between one end of the second inductor 232 and a ground.

Capacitances of the first, second, third, and fourth capacitors 251, 252, 253, and 254 and inductances of the first and second inductors 231 and 232 may provide a resonant frequency of the RF splitter 200b, and the RF splitter 200b may have a wider bandwidth based on the provided resonant frequency.

For example, the first, second, third, and fourth capacitors 251, 252, 253, and 254 and the first and second inductors 231, 232 may have impedances such that an RF signal of a fundamental frequency, belonging to a band of 5.1 GHz to 7.2 GHz, is transferred to at least one of the first and second reception ports RP1 and RP2. Accordingly, the front-end module 100d may have a wide bandwidth stably covering a frequency band corresponding to W-Fi and a frequency band corresponding to LTE-LAA.

Referring to FIG. 2B, the second branch switch may include series switches 132b-4, 132b-7, and 132b-13, shunt switches 132b-5, 132b-8, and 132b-14, and capacitors 132b-6, 132b-9, and 132b-15.

A bypass path may include a series switch 115b-3 and resistors 115b-1 and 115b-2.

Figure 2C:
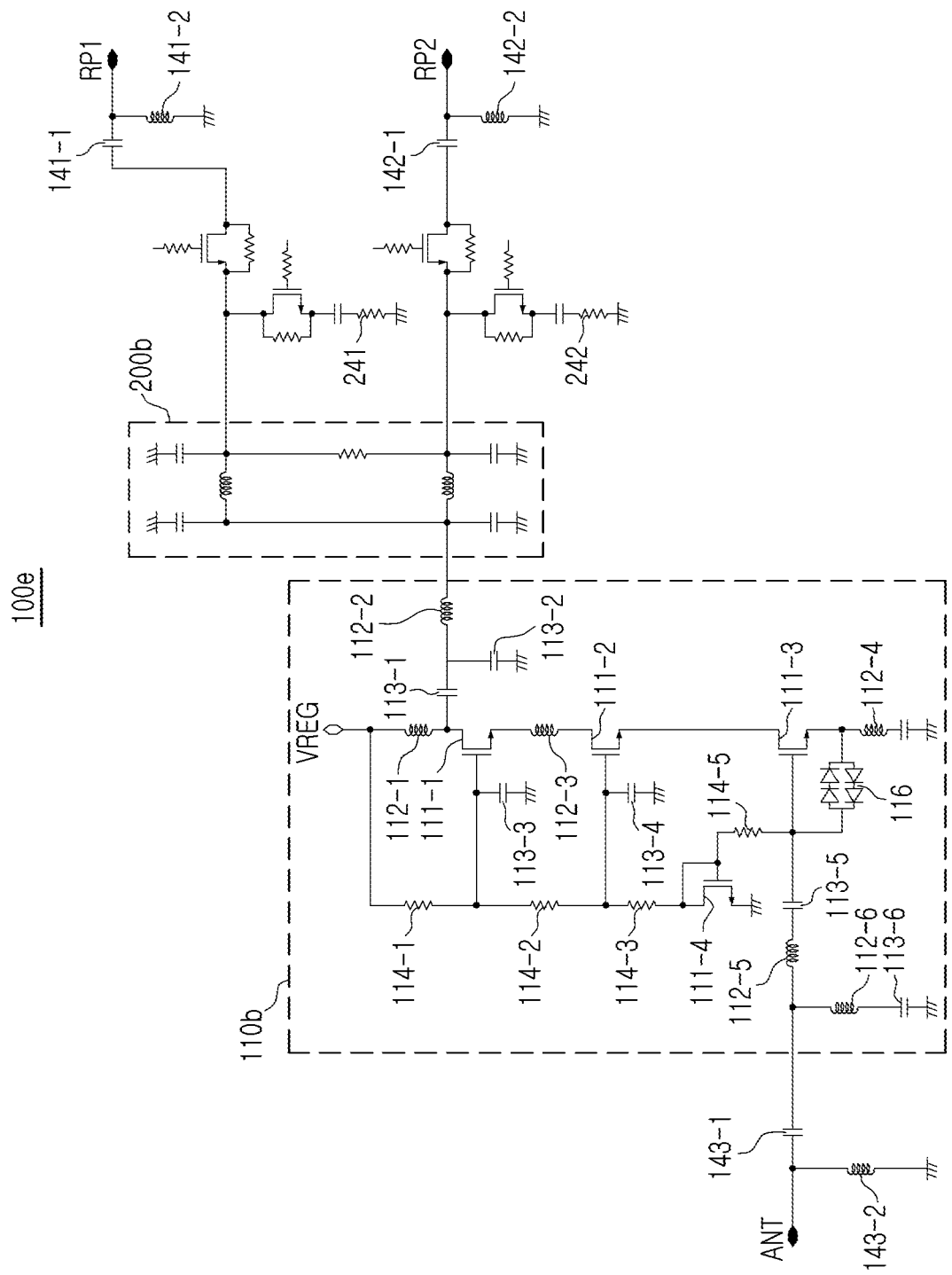
FIG. 2C is a circuit diagram illustrating a structure in which a bypass circuit of a reception amplifier is omitted in an example front-end module, in accordance with one or more embodiments.

FIG. 2C is a circuit diagram illustrating a structure in which a bypass circuit of a reception amplifier is omitted in a front-end module, in accordance with one or more embodiments.

Referring to FIG. 2C, a reception amplifier 110b of a front-end module 100e according to an example may include at least a portion of a first amplifier transistor 111-1, a second amplifier transistor 111-2, a third amplifier transistor 111-3, a feedback transistor 111-4, a shunt output inductor 112-1, a series output capacitor 113-1, a shunt output capacitor 113-2, a series output inductor 112-2, an intermediate inductor 112-3, a source inductor 112-4, an input inductor 112-6, gate capacitors 113-3, 113-4, and 113-5, an input capacitor 113-6, gate resistors 114-1, 114-2, 114-3, and 114-5, and a back-to-back diode 116.

Among the first, second, and third amplifier transistors 111-1, 111-2, and 111-3, at least two amplifier transistors may be combined in a cascode structure. Accordingly, a gain of the reception amplifier 110b may be further increased, and frequency characteristics of the reception amplifier 110b may be further improved.

The intermediate inductor 112-3 may be electrically connected in series between two amplifier transistors, among the first, second, and third amplifier transistors 111-1, 111-2, and 111-3. Accordingly, since the intermediate inductor 112-3 may cancel parasitic capacitances of the first, second, and third amplifier transistors 111-1, 111-2, and 111-3, the intermediate inductor 112-3 may further increase the gain of the reception amplifier 110b and may further widen a bandwidth of the reception amplifier 110b.

The shunt output inductor 112-1 may be electrically connected in series between an output terminal of the first amplifier transistor 111-1 and power source VREG, the series output capacitor 113-1 may be electrically connected in series between an output terminal of the first amplifier transistor 111-1 and the RF splitter 200b, the shunt output capacitor 113-2 may be electrically connected in series between the output terminal of the first amplifier transistor 111-1 and the RF splitter 200b, and a ground output, and the series output inductor 112-2 may be electrically connected in series between the output terminal of the first amplifier transistor 111-1 and the RF splitter 200b.

Accordingly, the reception amplifier 110b may have a wider bandwidth based on a resonant frequency of the output impedance.

The input inductor 112-6 and the input capacitor 113-6 may include a notch filter, and may have a resonant frequency corresponding to a frequency of a second or third harmonic wave of the received RF signal (for example, 2.4 GHz). Accordingly, the input inductor 112-6 and the input capacitor 113-6 may remove the harmonic wave of the received RF signal generated by amplification of the reception amplifier 110b.

The back-to-back diode 116 may stably provide an electrostatic discharge path of the reception amplifier 110b.

A matching terminal of the first reception port RP1 may include a series capacitor 141-1 and a shunt inductor 141-2, a matching terminal of the second reception port RP2 may include a series capacitor 142-1 and a shunt inductor 142-2, a matching terminal of the antenna port ANT may include a series capacitor 143-1 and a shunt inductor 143-2.

Accordingly, since the matching terminal may remove the harmonic wave of the received RF signal generated by amplification of the reception amplifier 110b and may reduce overall parasitic reactance of the front-end module 100e, insertion loss at a relatively high frequency band (for example, 6 GHz) may be reduced, an overall frequency band of the front-end module 100e may be easily increased, and an overall electrostatic discharge path of the front-end module 100e may be stably secured.

Figure 2D:
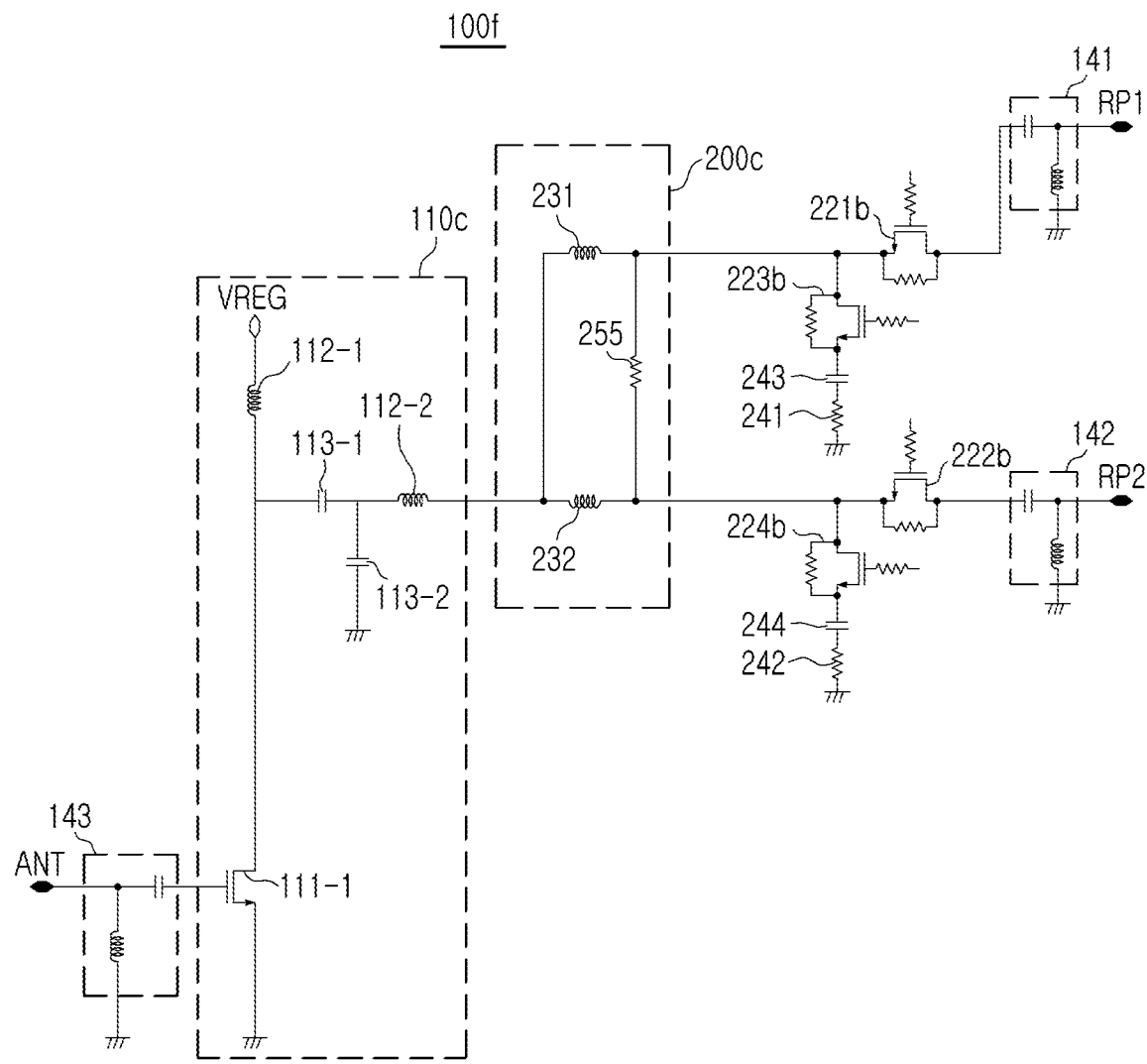
FIG. 2D is a circuit diagram illustrating a simplified structure of a reception amplifier and a simplified structure of a radio-frequency (RF) splitter in an example front-end module, in accordance with one or more embodiments.

FIG. 2D is a circuit diagram illustrating a simplified structure of a reception amplifier and a simplified structure of a radio-frequency (RF) splitter in a front-end module, in accordance with one or more embodiments.

Referring to FIG. 2D, a reception amplifier 110c of a front-end module 100f according to an example may have a structure simplified more than the structure of the reception amplifier illustrated in FIG. 2C, and a radio-frequency (RF) splitter 200c may have a structure simplified more than the structure of the reception amplifier illustrated in FIG. 2B.

Figure 3:
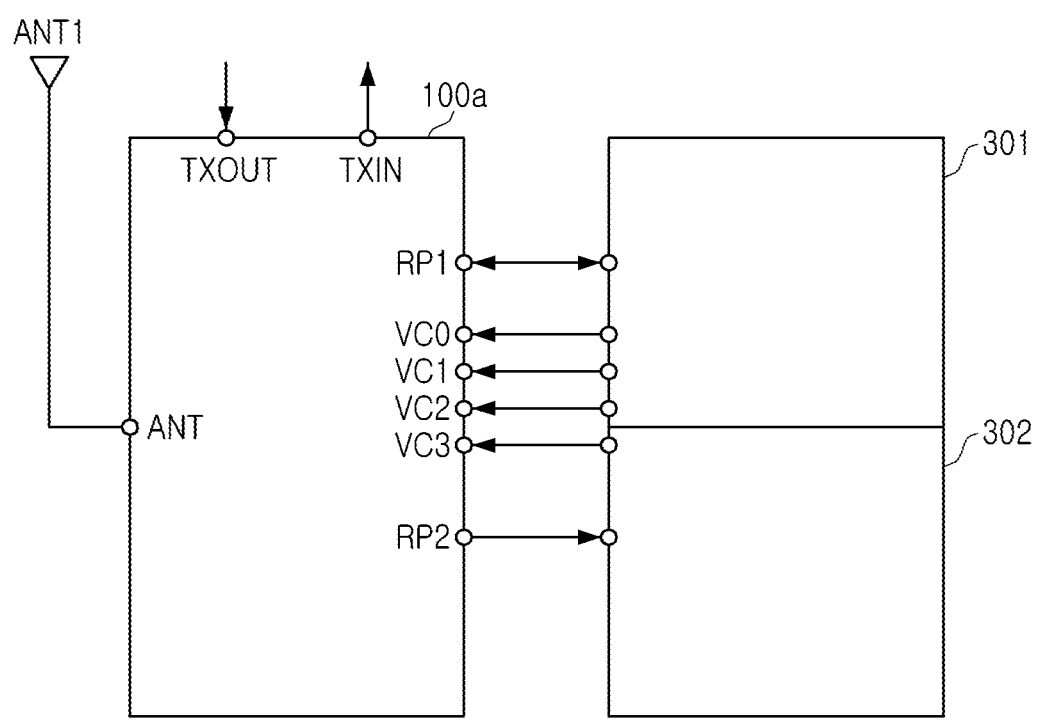
FIG. 3 illustrates a peripheral structure of an example front-end module, in accordance with one or more embodiments.

FIG. 3 illustrates a peripheral structure of a front-end module in accordance with one or more embodiments.

Referring to FIG. 3, a front-end module 100a according to an example may be electrically connected to an antenna ANT1 through an antenna port ANT, may be electrically connected to a first communication modem 301 through a first reception port RP1, and may be electrically connected to a second communication modem 302 through a second reception port RP2.

In an example, the front-end module 100a may be electrically connected to a transmission amplifier through a transmission amplifier input port TXIN and a transmission amplifier output port TXOUT, and may receive mode control voltages VC0, VC1, VC2, and VC3 from first and second communication modems 301 and 302.

The front-end module 100a, the first and second communication modems 301 and 302, and the antenna ANT1 may be disposed in an electronic device. The electronic device may be, as non-limiting examples, a smartphone, a personal digital assistant, a digital video camera, a digital still camera, a network system, a computer, a monitor, a tablet computer, a laptop computer, a netbook computer, a television, a video game console, a smartwatch, an automotive, or the like, but is not limited thereto.

An RF signal disclosed therein may have a form based on a protocol such as wireless fidelity (Wi-Fi) (Institute of Electrical And Electronics Engineers (IEEE) 802.11 family, or the like), worldwide interoperability for microwave access (WMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, any other wireless and wired protocols designated after the abovementioned protocols, or the like, but the form of the RF signal is not limited thereto.

As described above, a front-end module according to an example may support effective and stable reception of a received RF signal in both a first case, in which first and second communication modems operate at the same time, and a second case in which first and second communication modems operate in a time division duplexing manner, and may prevent performance deterioration resulting from a reflected wave of the received RF signal.

In addition, a front-end module according to an example may have a higher frequency band and a wider bandwidth.

While this disclosure includes specific examples, it will be apparent after an understanding of the disclosure of this application that various changes in forms and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A front-end module comprising:
a reception amplifier configured to amplify a received radio-frequency (RF) signal;
a first series switch configured to control a switching operation to electrically connect an output terminal of the reception amplifier and a first reception port to each other;
a second series switch configured to control a switching operation to electrically connect the output terminal of the reception amplifier and a second reception port to each other;
a radio-frequency (RF) splitter configured to simultaneously transfer one of a received RF signal that is amplified by the reception amplifier, and a received RF signal that bypasses the reception amplifier, to the first reception port and the second reception port;
a first shunt switch configured to control a switching operation to electrically connect a ground and a first branch node between the RF splitter and the first reception port to each other;
a second shunt switch configured to control a switching operation to electrically connect the ground and a second branch node between the RF splitter and the second reception port;
a first reflected wave removing impedance element electrically connected between the first branch node and the ground; and
a second reflected wave removing impedance element electrically connected between the second branch node and the ground.

2. The front-end module of claim 1, further comprising:
a controller configured to operate in a selected mode, among a first mode, a second mode, and a third mode, to control the first series switch and the second series switch, and control the first shunt switch and the second shunt switch,
wherein the controller, when configured to operate in the first mode, controls the first series switch and the second shunt switch in an ON state, and controls the second series switch and the first shunt switch in an OFF state,
the controller, when configured to operate in the second mode, controls the second series switch and the first shunt switch in an ON state, and controls the first series switch and the second shunt switch in an OFF state, and
the controller, when configured to operate in the third mode, controls the first series switch and the second series switch in an ON state, and controls the first shunt switch and the second shunt switch in an OFF state.

3. The front-end module of claim 2, wherein the RF splitter is configured to transfer a received RF signal of a first communications protocol to the first reception port when the controller operates in the first mode, and transfer a received RF signal of a second communications protocol, different from the first communications protocol, when the controller operates in the second mode, and
at least a portion of a frequency band of the first communications protocol and at least a portion of a frequency band of the second communications protocol overlap each other.

4. The front-end module of claim 2, further comprising:
a transceiving branch switch electrically connected between an input terminal of the reception amplifier and an antenna port;
a third series switch configured to control a switching operation to electrically connect the transceiving branch switch and the first reception port to each other; and
a third shunt switch configured to control a switching operation to electrically connect a ground and a node between the transceiving branch switch and the first reception port to each other;
wherein the transceiving branch switch is configured to transfer a received RF signal from the antenna port to one of the first reception port and the second reception port through the RF splitter when the transceiving branch switch operates in a receiving mode, and transfer a transmitted RF signal from the first reception port to the antenna port by bypassing the RF splitter when the transceiving branch switch operates in a transmitting mode.

5. The front-end module of claim 4, further comprising:
a transmission amplifier input port configured to be electrically connected to the third series switch, and to be electrically connected to an input terminal of an external transmission amplifier; and
a transmission amplifier output port configured to be electrically connected to the transceiving branch switch and to be electrically connected to an output terminal of the transmission amplifier.

6. The front-end module of claim 1, wherein the first series switch is configured to control a switching operation to electrically connect the first branch node and the first reception port to each other, and
the second series switch is configured to control a switching operation to electrically connect the second branch node and the second reception port to each other.

7. The front-end module of claim 1, wherein the first reflected wave removing impedance element is connected in series between the first branch node and the ground, and has a matched resistance value such that a reflected wave of a received RF signal passes from the first branch node to a ground, and
the second reflected wave removing impedance element is connected in series between the second branch node and the ground, and has a matched resistance value such that a reflected wave of a received RF signal passes from the second branch node to a ground.

8. The front-end module of claim 7, wherein the first reflected wave removing impedance element comprises a first reflected wave removing resistor and a first switch capacitor that are connected in series with each other, and
the second reflected wave removing impedance element comprises a second reflected wave removing resistor and a second switch capacitor that are connected in series with each other.

9. The front-end module of claim 1, wherein the RF splitter comprises:
a first inductor electrically connected in series between an output terminal of the reception amplifier and the first branch node;
a second inductor electrically connected in series between an output terminal of the reception amplifier and the second branch node; and
a resistor electrically connected between a second end of the first inductor and a second end of the second inductor.

10. The front-end module of claim 9, wherein the RF splitter comprises:
  a first capacitor electrically connected between a first end of the first inductor and a ground; and
  a second capacitor electrically connected between a first end of the second inductor and the ground.

11. The front-end module of claim 9, wherein the RF splitter further comprises:
  a first capacitor electrically connected between a first end of the first inductor and the ground;
  a second capacitor electrically connected between a first end of the second inductor and the ground;
  a third capacitor electrically connected between a second end of the first inductor and the ground; and
  a fourth capacitor electrically connected between a second end of the second inductor and the ground.

12. The front-end module of claim 11, wherein the first capacitor, the second capacitor, the third capacitor, and the fourth capacitor, and the first inductor and the second inductor have impedances such that a received RF signal of a fundamental frequency, belonging to a band of 5.1 GHz to 7.2 GHz, is transferred to at least one of the first reception port and the second reception port.

13. The front-end module of claim 1, wherein the reception amplifier comprises:
  a first amplifier transistor and a second amplifier transistor combined in a cascode configuration; and
  an intermediate inductor electrically connected in series between the first amplifier transistor and second amplifier transistors.

14. The front-end module of claim 1, wherein the reception amplifier comprises:
  a shunt output inductor electrically connected in series between an output terminal of the first amplifier transistor and a power source;
  a series output capacitor electrically connected in series between the output terminal of the first amplifier transistor and the RF splitter;
  a shunt output capacitor electrically connected in series between the output terminal of the first amplifier transistor and the RF splitter, and a ground; and
  a series output inductor electrically connected in series between the output terminal of the first amplifier transistor and the RF splitter.

* * * * *